(12) United States Patent
Wu et al.

(10) Patent No.: US 9,372,206 B2
(45) Date of Patent: Jun. 21, 2016

(54) TESTING OF SEMICONDUCTOR CHIPS WITH MICROBUMPS

(71) Applicant: TAIWAN SEMICONDUCTOR MANUFACTURING COMPANY, LTD., Hsinchu (TW)

(72) Inventors: Wei-Cheng Wu, Hsinchu (TW); Hsien-Pin Hu, Zhubei (TW); Shang-Yun Hou, Hsinchu (TW); Shin-Puu Jeng, Hsinchu (TW); Chen-Hua Yu, Hsinchu (TW); Chao-Hsiang Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/833,950

(22) Filed: Aug. 24, 2015

(65) Prior Publication Data
US 2015/0362526 A1 Dec. 17, 2015

Related U.S. Application Data

(63) Continuation of application No. 14/331,791, filed on Jul. 15, 2014, now Pat. No. 9,116,203, which is a continuation of application No. 13/025,931, filed on Feb. 11, 2011, now Pat. No. 8,797,057.

(51) Int. Cl.
*G01R 31/00* (2006.01)
*G01R 1/04* (2006.01)
(Continued)

(52) U.S. Cl.
CPC .......... *G01R 1/0416* (2013.01); *G01R 31/2601* (2013.01); *G01R 31/2884* (2013.01);
(Continued)

(58) Field of Classification Search
CPC ........... G01R 31/2893; G01R 31/2886; G01R 31/2889; G01R 31/2887; G01R 31/2601; G01R 31/2884; G01R 31/2896; G01R 1/07378; G01R 1/0416; H01L 22/32; H01L 24/06

USPC ............... 324/754, 756.07, 757, 758; 438/18, 438/613, 614
See application file for complete search history.

(56) References Cited

U.S. PATENT DOCUMENTS

| 4,811,082 A | * | 3/1989 | Jacobs | ................. | H01L 23/538 |
| | | | | | 174/261 |
| 4,990,462 A | * | 2/1991 | Sliwa, Jr. | ................. | H01L 23/52 |
| | | | | | 148/DIG. 28 |

(Continued)

FOREIGN PATENT DOCUMENTS

| EP | 0632281 | 1/1995 | | |
| GB | CA 2127234 A1 | * | 1/1995 | ............. G01R 1/073 |
| GB | EP 0632281 A2 | * | 1/1995 | ............. G01R 1/073 |

*Primary Examiner* — Patrick Assouad
*Assistant Examiner* — Sean Curtis
(74) *Attorney, Agent, or Firm* — Eschweiler & Associates, LLC

(57) ABSTRACT

A package includes a semiconductor chip. The semiconductor chip includes a test pad, and a plurality of microbump pads, wherein each microbump pad of the plurality of microbump pads is electrically connected to the test pad. The package further includes a substrate; and a plurality of microbumps configured to electrically connect the semiconductor chip to the substrate, wherein each microbump of the plurality of microbumps is electrically connected to a corresponding microbump pad of the plurality of microbump pads. The package further includes a package substrate, wherein the package substrate comprises a bump pad, wherein an area of the bump pad is greater than a combined area of the test pad and the plurality of microbump pads. The package further includes a bump configured to electrically connect the substrate to the package substrate.

20 Claims, 7 Drawing Sheets

(51) Int. Cl.
 *G01R 31/28* (2006.01)
 *H01L 21/66* (2006.01)
 *G01R 31/26* (2014.01)
 *H01L 23/00* (2006.01)

(52) U.S. Cl.
 CPC ........ *G01R31/2886* (2013.01); *G01R 31/2889* (2013.01); *G01R 31/2893* (2013.01); *G01R 31/2896* (2013.01); *H01L 22/32* (2013.01); *H01L 24/06* (2013.01); *H01L 24/03* (2013.01); *H01L 24/05* (2013.01); *H01L 24/11* (2013.01); *H01L 24/13* (2013.01); *H01L 2224/02377* (2013.01); *H01L 2224/0392* (2013.01); *H01L 2224/0401* (2013.01); *H01L 2224/05027* (2013.01); *H01L 2224/05147* (2013.01); *H01L 2224/05552* (2013.01); *H01L 2224/05568* (2013.01); *H01L 2224/05655* (2013.01); *H01L 2224/0614* (2013.01); *H01L 2224/0616* (2013.01); *H01L 2224/1146* (2013.01); *H01L 2224/1147* (2013.01); *H01L 2224/11849* (2013.01); *H01L 2224/13005* (2013.01); *H01L 2224/13083* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/14131* (2013.01); *H01L 2224/16238* (2013.01)

(56) References Cited

U.S. PATENT DOCUMENTS

| | | | |
|---|---|---|---|
| 5,075,253 A | 12/1991 | Sliwa, Jr. | |
| 5,380,681 A | 1/1995 | Hsu | |
| 5,406,210 A * | 4/1995 | Pedder | G01R 1/07307 324/756.05 |
| 5,481,133 A | 1/1996 | Hsu | |
| 5,554,940 A * | 9/1996 | Hubacher | G01R 1/07314 324/762.03 |
| 5,678,301 A * | 10/1997 | Gochnour | H05K 3/4007 257/69 |
| 5,726,075 A * | 3/1998 | Farnworth | H01L 21/4853 205/205 |
| 5,789,271 A * | 8/1998 | Akram | H01L 21/4853 257/E23.067 |
| 5,808,360 A * | 9/1998 | Akram | H01L 21/4853 228/180.22 |
| 5,834,945 A * | 11/1998 | Akram | G01R 1/0483 324/756.05 |
| 6,002,177 A * | 12/1999 | Gaynes | H01L 23/481 257/686 |
| 6,016,060 A * | 1/2000 | Akram | G01R 1/0466 324/754.08 |
| 6,060,891 A * | 5/2000 | Hembree | G01R 31/2886 324/755.04 |
| 6,091,252 A * | 7/2000 | Akram | G01R 1/0466 324/750.05 |
| 6,184,066 B1 * | 2/2001 | Chino | H01L 21/563 257/E21.503 |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 * | 8/2001 | Bertin | H01L 23/13 257/E21.511 |
| 6,279,815 B1 | 8/2001 | Correia et al. | |
| 6,314,641 B1 * | 11/2001 | Akram | G01R 1/0466 29/843 |
| 6,335,271 B1 * | 1/2002 | Fukuyama | H01L 21/4853 257/E21.508 |
| 6,342,399 B1 * | 1/2002 | Degani | H01L 24/05 257/685 |
| 6,355,501 B1 | 3/2002 | Fung et al. | |
| 6,434,016 B2 * | 8/2002 | Zeng | 174/255 |
| 6,437,990 B1 * | 8/2002 | Degani | H01L 23/49816 257/723 |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,617,687 B2 * | 9/2003 | Akram | G01R 1/0483 228/180.22 |
| 6,661,085 B2 * | 12/2003 | Kellar | H01L 24/13 257/686 |
| 6,762,076 B2 | 7/2004 | Kim et al. | |
| 6,790,748 B2 | 9/2004 | Kim et al. | |
| 6,798,224 B1 * | 9/2004 | Hembree | G01R 31/2886 324/754.12 |
| 6,887,769 B2 * | 5/2005 | Kellar | H01L 23/481 257/E21.705 |
| 6,908,565 B2 * | 6/2005 | Kim | H01L 25/0657 216/2 |
| 6,908,785 B2 * | 6/2005 | Kim | H01L 21/76898 257/E21.597 |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,084,487 B1 * | 8/2006 | Conn | H01L 23/552 257/660 |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 * | 10/2007 | Lee | H01L 21/76898 257/774 |
| 7,279,795 B2 * | 10/2007 | Periaman | H01L 25/0657 257/772 |
| 7,307,005 B2 | 12/2007 | Kobrinsky et al. | |
| 7,317,256 B2 * | 1/2008 | Williams | H01L 25/0657 257/685 |
| 7,320,928 B2 | 1/2008 | Kloster et al. | |
| 7,345,350 B2 | 3/2008 | Sinha | |
| 7,355,264 B2 * | 4/2008 | Degani | H01F 17/0006 257/528 |
| 7,402,442 B2 * | 7/2008 | Condorelli | H01L 23/5383 257/665 |
| 7,402,515 B2 | 7/2008 | Arana et al. | |
| 7,410,884 B2 * | 8/2008 | Ramanathan | H01L 21/76898 257/686 |
| 7,432,592 B2 * | 10/2008 | Shi | H01L 23/473 257/714 |
| 7,494,845 B2 | 2/2009 | Hwang et al. | |
| 7,528,494 B2 * | 5/2009 | Furukawa | H01L 21/76898 257/777 |
| 7,531,890 B2 | 5/2009 | Kim | |
| 7,557,597 B2 | 7/2009 | Anderson et al. | |
| 7,576,435 B2 * | 8/2009 | Chao | H01L 23/49816 257/774 |
| 7,642,128 B1 * | 1/2010 | Lin | H01L 21/6835 257/E21.508 |
| 7,834,450 B2 * | 11/2010 | Kang | G11C 5/02 257/724 |
| 8,237,274 B1 * | 8/2012 | Rahman | H01L 24/17 257/693 |
| 8,609,526 B2 * | 12/2013 | Liu | H01L 24/11 257/E21.023 |
| 8,659,155 B2 * | 2/2014 | Cheng | H01L 24/11 257/737 |
| 2001/0026013 A1 * | 10/2001 | Mess | H01L 22/26 257/686 |
| 2006/0195020 A1 * | 8/2006 | Martin | G06F 19/3475 600/301 |
| 2008/0251906 A1 * | 10/2008 | Eaton | H01L 25/0655 257/686 |
| 2008/0308297 A1 * | 12/2008 | Jurenka | H01L 24/02 174/126.2 |
| 2009/0218571 A1 * | 9/2009 | Chen | H01L 27/1288 257/59 |

(56) References Cited

U.S. PATENT DOCUMENTS

| | | | | |
|---|---|---|---|---|
| 2010/0213600 A1* | 8/2010 | Lau | ................ | H01L 23/055 257/693 |
| 2011/0042820 A1* | 2/2011 | Knickerbocker | . | H01L 21/76898 257/774 |
| 2011/0092064 A1* | 4/2011 | Liu | ................ | H01L 24/11 438/612 |
| 2012/0206160 A1* | 8/2012 | Wu | ................ | G01R 31/2884 324/756.07 |
| 2013/0200528 A1* | 8/2013 | Lin | ................ | H01L 21/6836 257/774 |

* cited by examiner

TESTING OF SEMICONDUCTOR CHIPS WITH MICROBUMPS

PRIORITY CLAIM

The present application is a continuation of U.S. application Ser. No. 14/331,791, filed Jul. 15, 2014, which is a continuation of U.S. application Ser. No. 13/025,931, filed Feb. 11, 2011, now U.S. Pat. No. 8,797,057, issued Aug. 5, 2014, the disclosures of which are incorporated herein by reference in their entireties.

FIELD

This disclosure relates generally to integrated circuits, and more particularly to testing of semiconductor chips with microbumps.

BACKGROUND

Integrated circuits have experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

The volume occupied by the integrated components is near the surface of the semiconductor wafer. Although dramatic improvements in lithography have resulted in considerable improvements in two-dimensional (2D) integrated circuit formation, there are physical limitations to the density that can be achieved in two dimensions. One of these limitations is the minimum size needed to make these components. Further, when more devices are put into one chip, more complex designs are required. An additional limitation comes from the significant gains in the number and length of interconnections between devices as the number of devices increases. When the number and length of interconnections increase, both circuit resistive-capacitive (RC) delay and power consumption increase.

Three-dimensional integrated circuits (3DIC) were thus formed to address issues raised by increase in circuit densities. The dies are stacked, with wire-bonding, flip-chip bonding, and/or through-silicon vias (TSV) being used to stack the dies together and to connect the dies to package substrates. Circuit probe (CP) testing of advanced semiconductor chips and 3DIC with high device density becomes challenging.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION

Figure 1:
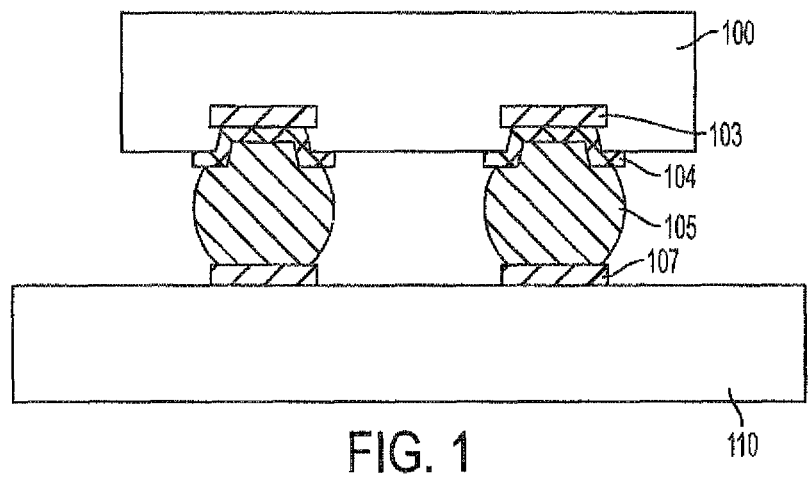
FIG. 1 shows a schematic diagram of an integrated circuit (IC) chip on a package substrate, in accordance with some embodiments.

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Modern integrated circuits are made of millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through these bond pads to connect the chip to a package substrate or another die. Bond pads can be used for wire bonding or flip-chip bonding. Flip-chip packaging utilizes bumps to establish electrical contact between a chip's I/O pads and the substrate or lead frame of the package.

FIG. 1 shows a schematic diagram of an integrated circuit (IC) chip 100 on a package substrate 110, in accordance with some embodiments. IC chip 100 is packaged with flip-chip packaging by forming bumps 105 on the front-side of the IC chip 100. Bumps 105 electrically and possibly physically contact the I/O pads (metal pads) 103 of the IC chip 100. In some embodiments, there is an under bump metallurgy (UBM) layer 104 between the bumps 105 and the metal pads 103. The IC chip 100 with the bumps 105 is flipped over to be placed on a package substrate 110. The surface of substrate 110 may have metal pads 107 to receive bumps 105. In some embodiments, the space between and around the IC chip 100, the bumps 105 and the substrate 100 could be filled with an under-fill material (not shown). The embodiment shown in FIG. 1A is merely an example. Other embodiments are also possible. IC chip 100 with bumps 105 could be applied on other types of substrates, such as an application board, and a substrate with embedded passive and/or active devices.

Conventionally, the sizes of the flip chip bumps are equal to or greater than about 75 μm. The sizes of the conventional flip chip bumps allow the semiconductor chips connected to the bumps to be electrically tested to determine whether the circuits under (or connected) to the bumps pass functional tests. Sometimes such as tests may also called circuit probe (CP), or electronic die sort (EDS).

Figure 2:
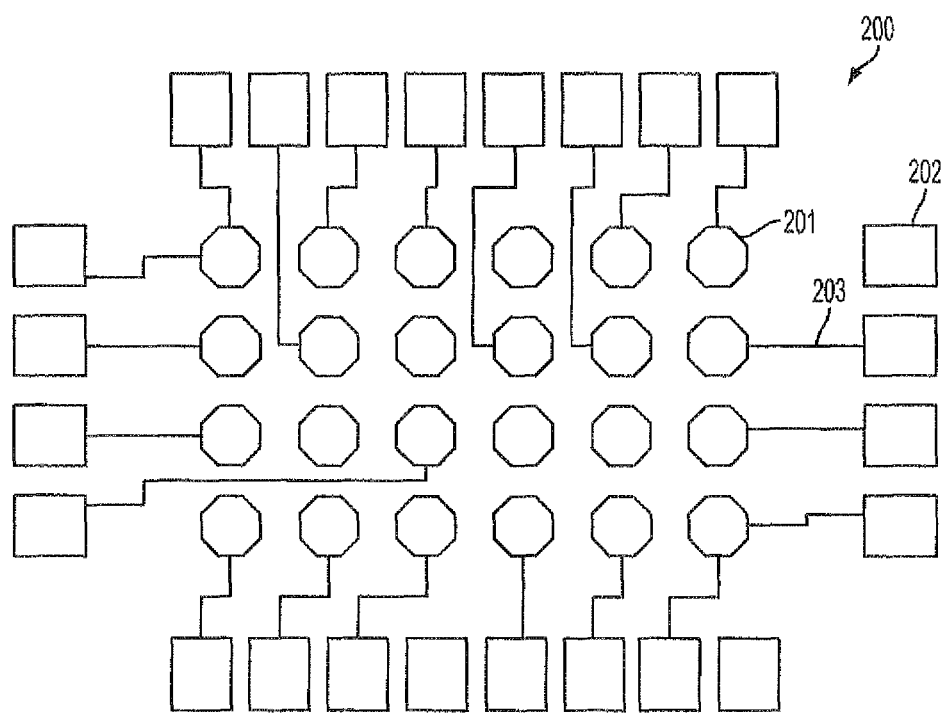
FIG. 2 shows a top schematic view of a portion of a semiconductor chip with bumps, in accordance with some embodiments.

Conventional bumps, such as bumps 105, can be probed for such tests. Alternatively, test pads can be added to allow functional tests. FIG. 2 shows a top schematic view of a portion 200 of a semiconductor chip with bumps, in accordance with some embodiments. The metal pads (or bump pads) 201 under bumps are represented by octagons in FIG. 2. As shown in FIG. 1, bumps (not shown) may be placed directly above these metal pads. There are a number of test pads 202 surrounding the metal pads 201 (and bumps above them). The test pads are connected to the metal pads via conductive lines 203. The conductive lines may be redistribution lines (RDLs), which are formed above the metal pads under the bumps, metal lines, or post-passivation interconnects (PPI). The test pads 202 may be at the same or at different level as the conductive lines 203. The test pads 202 are connected to different bumps 201 to perform functional tests. However, placing the test pads 202 around the bumps 201 takes away the real-estate on the surface of the semiconductor chip.

As feature size scales down, the number of transistors and interconnects on a chip has increased continuously. As a result, the number of chip to package input/output (I/O) interconnects have also increased significantly. With the increased chip to package I/O interconnects, the sizes of bumps could be reduced to equal to or less than about 50 μm. Such reduced-size bumps are called "microbumps."

Figure 3:
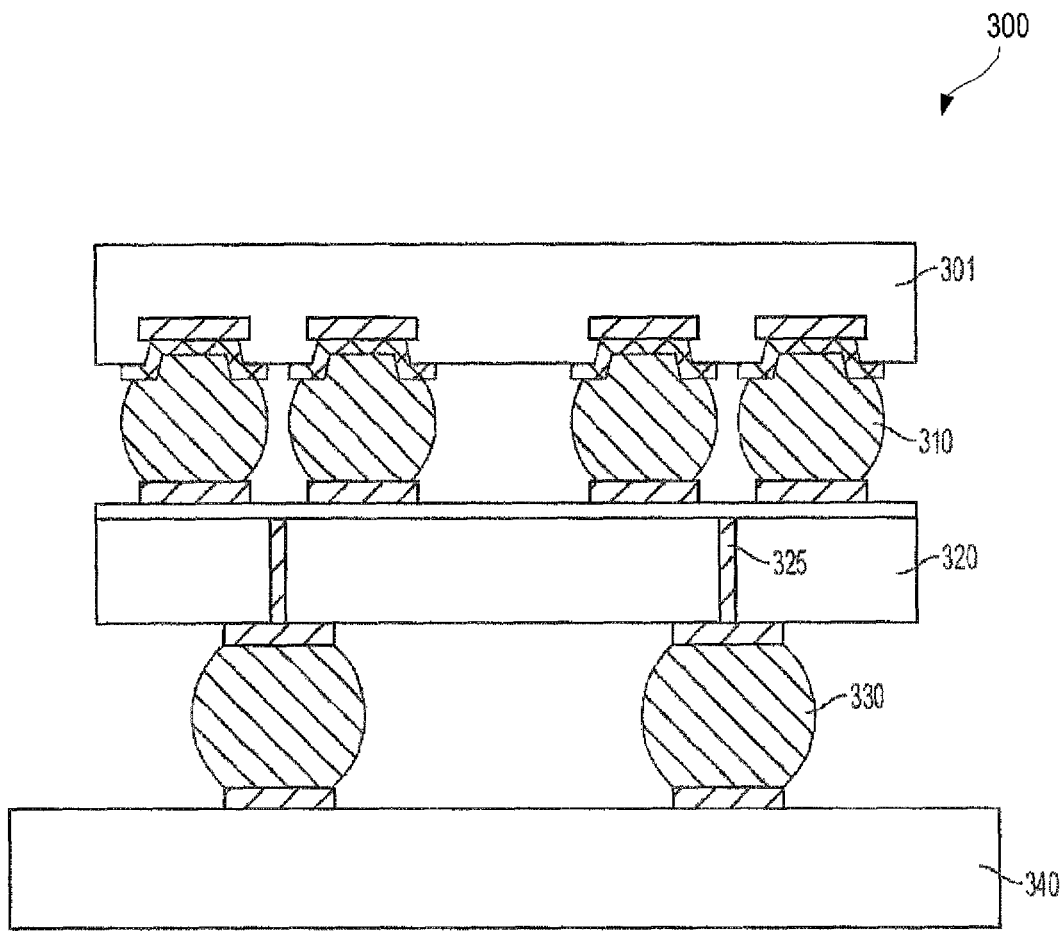
FIG. 3 shows a schematic diagram of a packaged semiconductor chip involving microbumps, in accordance with some embodiments.

FIG. 3 shows a schematic diagram of a packaged semiconductor chip involving microbumps, in accordance with some embodiments. A semiconductor chip 300 (a flipped chip) is disposed on a silicon substrate 320, which has through silicon vias 325 for assisting heat dissipation. The silicon substrate 320 may or may not have active devices on the substrate. The semiconductor chip 300 is connected to silicon substrate 320 via microbumps 310. The silicon substrate 320 is placed on another package substrate 340, with bumps 330, which are regular bumps and are larger than microbumps 310.

After semiconductor chip 300 is prepared, and before it is placed on substrate 320, it is desirable to perform electrical tests on chip 300 to determine if the circuits on chip 300 meet the specification of functional tests. If the test results show problems with chip 300, chip 300 could be discarded and another good chip could be used instead. Such screening can prevent the entire package shown in FIG. 3 from being discarded and can increase package yield, which would result in cost-saving.

As mentioned above, conventional flip chip bumps, with sizes equal to or greater than about 75 μm, allow circuit probing (or electrical tests). However, the current circuit probes are too large for microbumps (or μbumps). For example, the sizes (or widths) of the tips of probes may be in a range from about 2.5 mil to about 5 mil, which are too large for microbumps. An alternative for testing semiconductor chips with microbumps would be to use test pads, such as those described in FIG. 2. However, test pads occupy the precious real-estate on the surface of the semiconductor chip, as mentioned above.

As mentioned above, regular bumps are much larger than microbumps. For example, regular bumps have diameters in a range from about 75 μm to about 150 μm. In contrast, the diameters of microbumps are in a range from about 20 μm to about 50 μm, in accordance with some embodiments. As a result, extra space on the surface of semiconductor may become available due to the usage of microbumps.

Figure 4A:
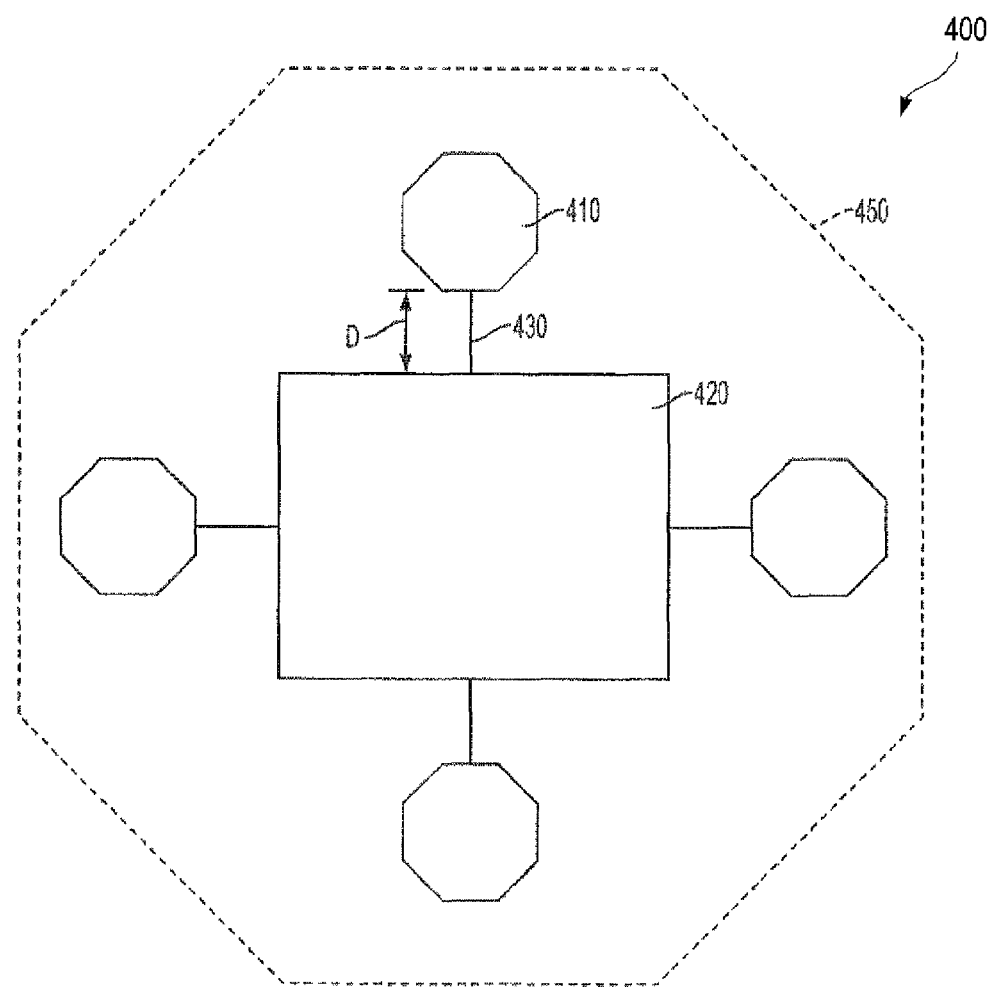
FIG. 4A shows a top view of a number of microbumps surrounding a test pad, in accordance with some embodiments.
Figure 4B:
FIG. 4B shows examples of shapes of the testing pads described above, in accordance with some embodiments.

FIG. 4A shows a top view 400 of a number of bump pads 410 surrounding a test pad 420, in accordance with some embodiments. FIG. 4A shows 4 bump pads 410 surrounding the test pad 420. The bump pads 410 are connected to test pad 420 via metal lines 430. Due to the smaller size of the microbumps, the bump pads 410 are also smaller, with widths only slightly larger than the 20 μm to about 50 μm. The exemplary bump pads 410 are shown to be in octagonal shape in FIG. 4A. Other shapes are also possible. The testing pad 420 is shown in FIG. 4A to be a square. The test pad 420 may also be in other shapes, such as a circle, a hexagon, an octagon, a rectangle, or other polygons. FIG. 4B shows examples of shapes of the testing pads 420 described above, in accordance with some embodiments. The smallest width of the test pads 420 is greater than about 60 μm, which allows probing tests, in accordance with some embodiments. The distance D between the bump pads 410 and the test pad 420 is in a range from about 20 μm to about 80 μm.

Since the microbumps are smaller than regular bumps. The surface space saved from using microbumps, instead of using regular bumps, could be used for the testing pads. Using the surface saved by using microbumps for test pad(s) can minimize the impact of the test pads occupying the real-estate of the surface of a semiconductor chip. FIG. 4A shows a pad area 450 for a regular bump, in accordance of some embodiments. The microbumps 410 and the testing pad 420 are within the pad area 450 of a regular bump. The microbumps 410 and the testing pad 420 could also occupy an area slightly larger than the pad area 450 of a regular bump. However, the usage of microbumps saves surface real-estate and can minimize the impact of having a test pad(s).

Figure 4C:
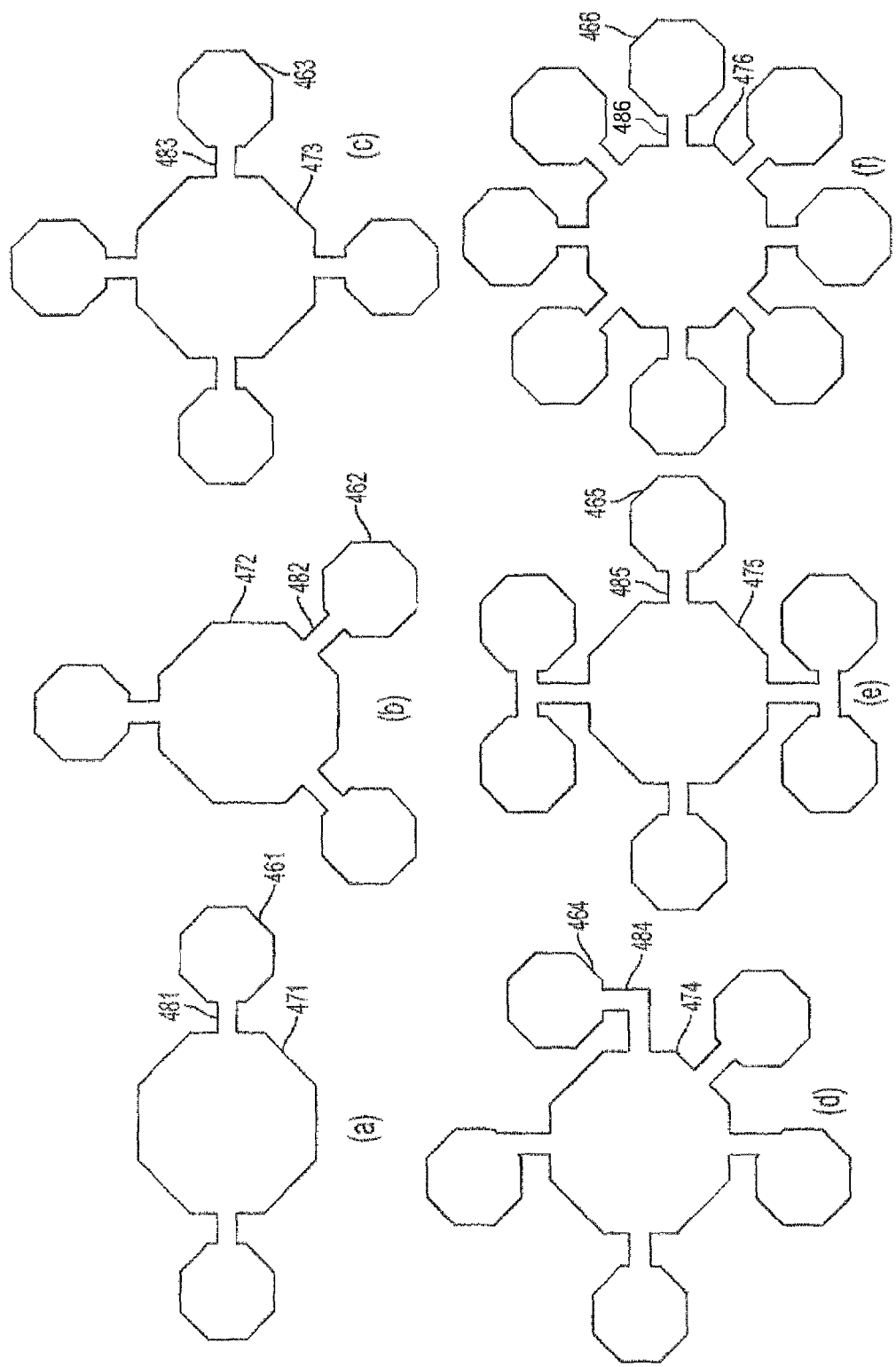
FIGS. 4C (a)-(f) show a top view of a number of configurations of microbumps with test pads, in accordance with some embodiments.

FIGS. 4C (a)-(f) show a top view of a number of configurations of microbumps with test pads, in accordance with some embodiments. In FIGS. 4C (a)-(f), the bump pads 461, 462, 463, 464, 465, and 466 surround the test pads 471, 472, 473, 474, 475, and 476 and are distributed symmetrically around the test pads. The probing areas are within the test pads due to coverage of edge areas by a passivation layer. Similarly, the microbumps are placed within the bump pads. The bump pads and testing pads are connected to one another via conductive lines 491, 492, 493, 494, 495, and 496, which are on the same level or different level of the metal pads, 461-466 and 471-476. The testing pads are illustrated to be in octagonal shapes. However, they could be in other shapes, as described in FIG. 4B. The bump pads under the microbumps are shown in octagonal shapes, which are also merely exemplary.

The number of bump pads (or microbumps) could be in a range from 2 to 8, in accordance with some embodiments. For smaller microbumps, the number of bumps can be even higher. Different numbers of microbumps could be connected to the test pads to allow performing functional tests of different devices connected to the same I/O connections and/or under the same input signals. For example, some functions of the semiconductor chip could involve applying or pulling signals (or current) from devices connected to a number of bumps. The different connections show in FIGS. 4C (a)-(f) allow such testing. The symmetrical configuration of bump pads for microbumps could make stress distribution due to the formation of microbumps more even, which could reduce the chance of interface delamination for the microbumps.

Figure 4D:
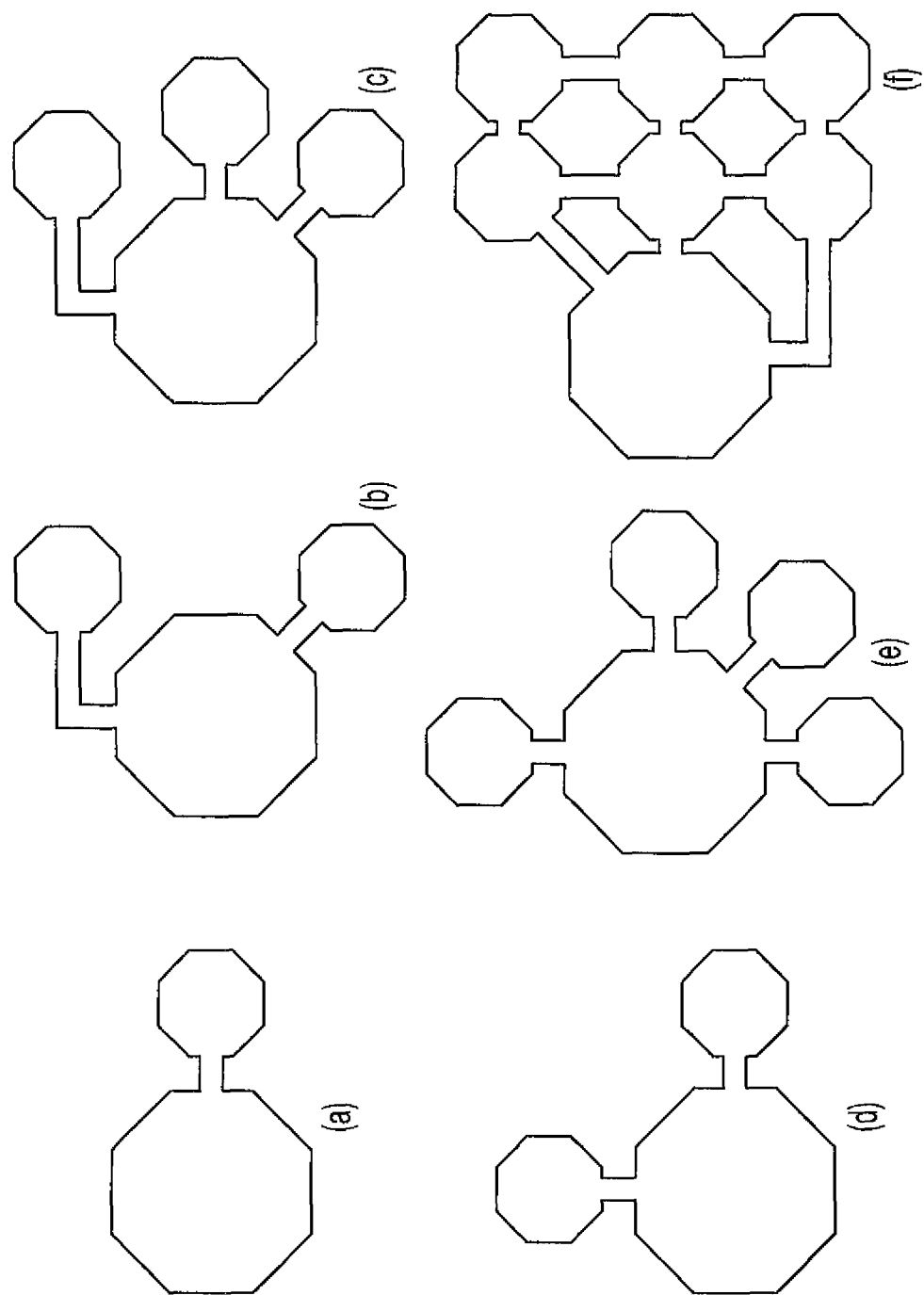
FIGS. 4D (a)-(f) show a top view of a number of configurations of microbumps with test pads, in accordance with some other embodiments.

Alternatively, the microbumps do not need to be distributed asymmetrically around the testing pads. FIGS. 4D (a)-(f) show a top view of a number of configurations of microbumps with test pads, in accordance with some other embodiments.

FIG. 4D (a)-(f) show different numbers of microbumps are connected to the testing pads and are arranged asymmetrically.

In some embodiments, there are a number of test pads with microbumps in some of the arrangements described above on a semiconductor chip. Different combinations could be needed on different chips to complete functional testing of various devices on the chips. For example, different inputs/outputs (I/Os), such as I/Os for signals, power, and ground (or grounding), need different numbers of microbumps due to different current requirement and also the $I_{max}$ (maximum current) limits of microbumps. Therefore, different combinations of numbers of microbumps are needed to allow testing.

Circuit probing can damage the metal pads, which leads to the copper seed layer coverage and poor bump plating (or formation). Poor bump formation could lead to particle and corrosion issues. However, if the testing pads are covered by a passivation layer after the testing is completed, the risks of such issues are completed resolved or greatly reduced.

Figure 5A:
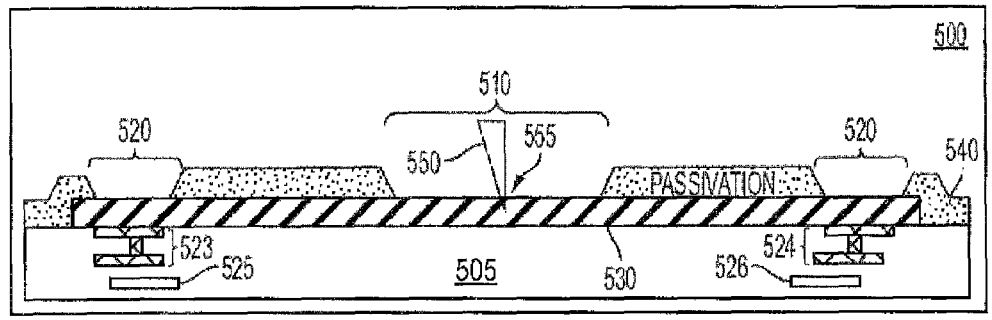
FIGS. 5A-5C are cross-sectional views of a region of a testing pad in a process of probing and formation of microbumps, in accordance with some embodiments.
Figure 5B:
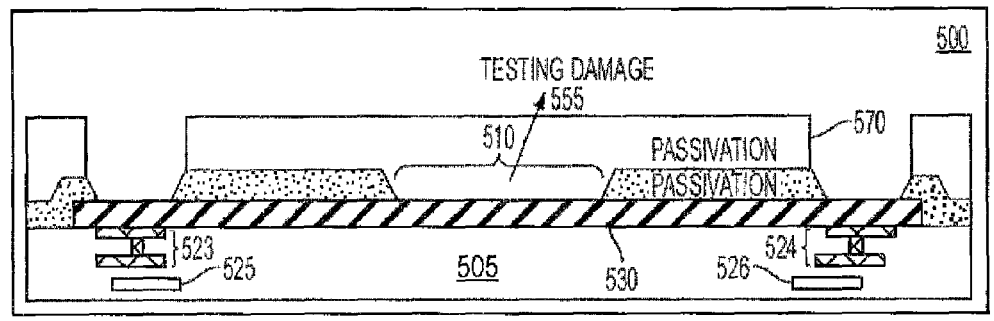
Figure 5C:
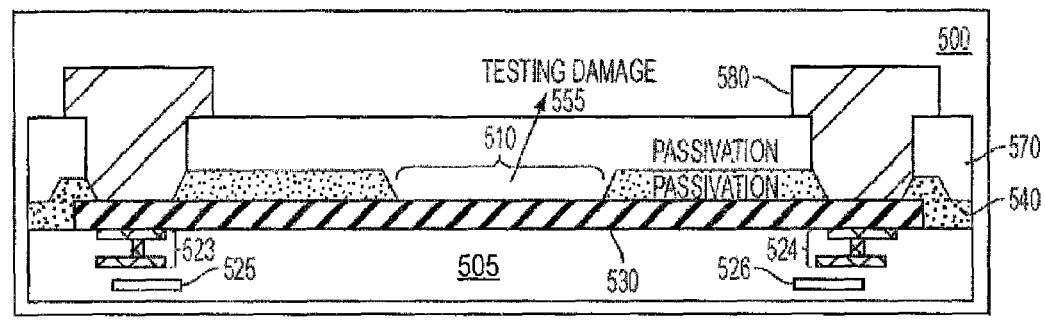

FIGS. 5A-5C are cross-sectional views of a region 500 of a testing pad in a process of probing and formation of microbumps, in accordance with some embodiments. FIG. 5A shows that a test pad region 510 and two opening regions (or bump pads) 520 for forming microbumps. Under the two opening regions (or bump pads) 520 for forming microbumps, there are interconnects 523, 524 connecting the to-be-formed microbumps with devices 525 and 526. The interconnect 523, 524 and devices 525, 526 (on substrate 505) shown in FIG. 5A are merely exemplary. Other configurations and additional interconnects/devices could be involved. The test pad region 510 is formed on a metal pad 530, which could be a top metal layer, a redistribution layer (RDL), or a post passivation interconnect (PPI) layer, in accordance with some embodiments. Regions 520 and test pad region 510 are electrically and physically connected. FIG. 5A shows that the test pad region 510 and the regions 520 are defined by a first passivation layer 540 through lithographical patterning. The first passivation layer 540 is deposited over the metal pad 530. The test pad region 510 is separated from the regions 520 so that the microbumps formed in regions 520 would be physically separated from the test pad 510. The outline(s) of the conductive line(s) between test pad and microbump pad(s) are also defined by the first passivation layer, which is not shown in FIG. 5A.

FIG. 5A shows a probe 550 touching the test pad region 510. The probing causes damage (see region 555) on the surface of the test pad region 510. The probing in test pad region 510 allowed electrical data related to devices connected to regions 520 to be tested. As mentioned above, the regions for forming microbumps that are connected to the test pad could be in a range from 1 to many. After the probing is completed, microbumps will be formed on regions 520. In some other embodiments, an UBM layer (not shown) is formed after the probing is performed. The UBM layer is under the microbumps to provide a diffusion barrier and to enhance adhesion. In some embodiments, the UBM layer (not shown) is formed to cover the openings 520 before probing is performed. The structure of microbumps with details of the UBM layer will be described later. The formation of the UBM layer involves deposition, patterning and etching the UBM layer. After the UBM layer is formed, the substrate a second passivation layer 570 is deposited and patterned to expose regions 520. The second passivation layer 570 may be made of an organic polymer, such as polyimide. In some embodiments, the second passivation layer 570 is made of a photosensitive polyimide. In some other embodiments, the second passivation layer 570 may be a dielectric material, which may be deposited by chemical vapor deposition or by spin-on. For example, the dielectric material may be $SiO_2$, SiN, or other suitable passivation material. The test pad region 520 is covered by the second passivation layer 570; therefore, the issues such as particles and corrosion due to test pad damage are resolved. The damaged area is covered and protected. In some embodiments, the thickness of the second passivation layer 570 is in a range from about 1 μm to about 10 μm. In some other embodiments, the thickness of the second passivation layer 570 is in a range from about 2 μm to about 5 μm.

FIG. 5C shows the microbumps 580 formed on the substrate of FIG. 5B after the second passivation layer 570 is formed, in accordance with some embodiments. The microbumps 580 may be formed by plating, in accordance with some embodiments. Prior to plating the substrate, a photoresist, which could be wet or dry (not shown in FIG. 5C), is patterned over the second passivation layer 570 to define of the microbumps 580 above regions 520. The microbumps can be made of various materials, such as solder or copper. After the microbumps are deposited, substrate 505 may undergo a reflow process.

Figure 6A:
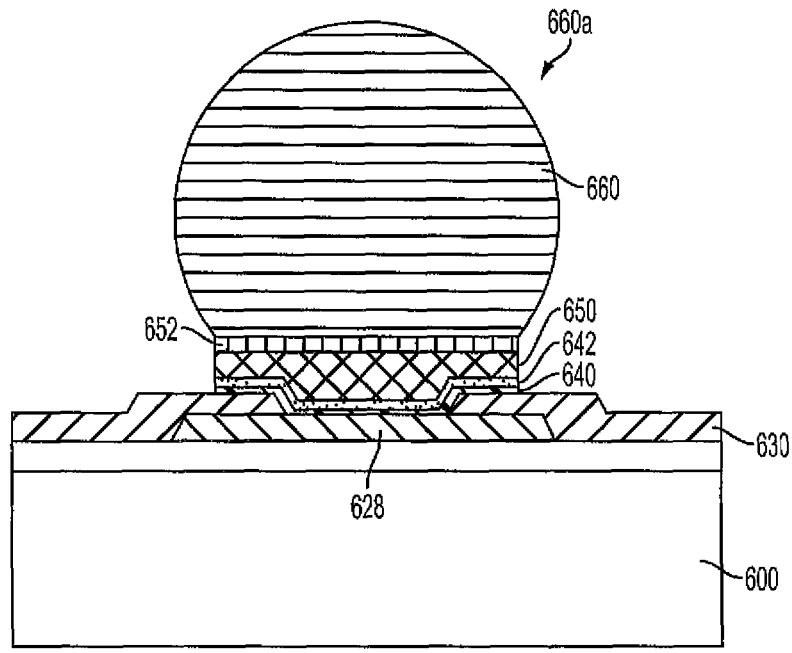
FIG. 6A shows a bump structure on a substrate, in accordance with some embodiments.
Figure 6B:
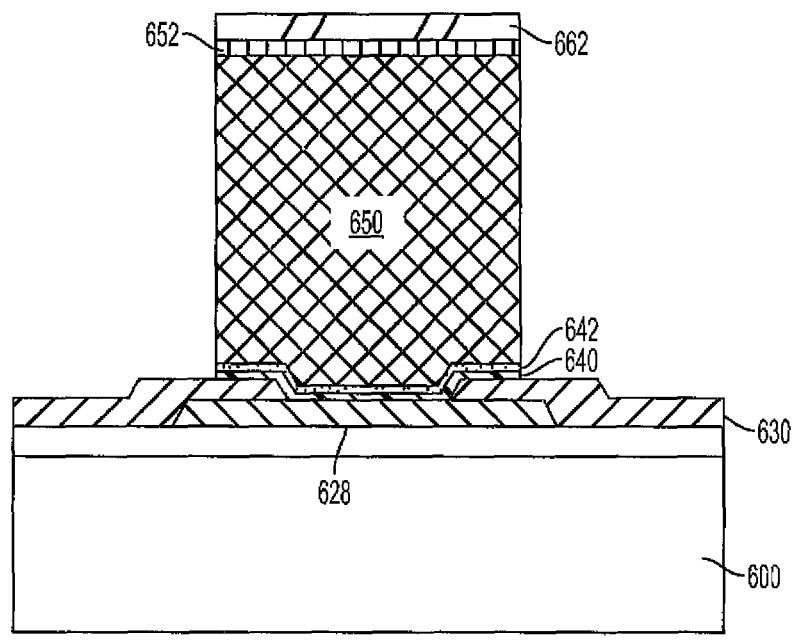
FIG. 6B shows a copper post on a substrate, in accordance with some embodiments.

The structures of microbumps and the processes of forming the microbumps could be similar to regular bumps. FIGS. 6A and 6B show two exemplary structures of microbumps on substrates, in accordance with some embodiments. FIG. 6A shows a bump structure on a substrate 600, in accordance with some embodiments. Metal pad 628, which is used as bump pad, is formed over one or more interconnect structures (not shown). Metal pad 628 may comprise aluminum, and hence may also be referred to as aluminum pad 628, although it may also be formed of, or include, other materials, such as copper, silver, gold, nickel, tungsten, alloys thereof, and/or multi-layers thereof. In some embodiments, a passivation layer 630 is formed to cover edge portions of metal pad 628. The passivation layer 630 may be formed of polyimide or other known dielectric materials. Additional passivation layers may be formed over the interconnect structures (not shown) and at the same level, or over, metal pad 628.

An opening is formed in passivation layer 630, with metal pad 628 exposed. A diffusion barrier layer 640 and a thin seed layer 642 are formed to cover the opening with the diffusion barrier layer 640 in contact with the metal pad 628, in accordance with some embodiments. Diffusion barrier layer 640 may be a titanium layer, a titanium nitride layer, a tantalum layer, or a tantalum nitride layer. The materials of seed layer 642 may include copper or copper alloys, and hence is referred to as copper seed layer 642 hereinafter. However, other metals, such as silver, gold, aluminum, and combinations thereof, may also be included. In some embodiments, diffusion barrier layer 640 and copper seed layer 642 are formed using sputtering.

A copper layer 650 may be deposited or plated on the exposed surface of copper seed layer 642, in accordance with some embodiments. A metal layer 652 may be optionally formed on the copper layer 650. In some embodiments, metal layer 652 is a nickel-containing layer comprising, for example, a nickel layer or a nickel alloy layer by plating. A solder layer 660 is formed on nickel layer 652, for example, by plating. Solder layer 660 may be a lead-free pre-solder layer formed of, for example, SnAg, or a solder material, including alloys of tin, lead, silver, copper, nickel, bismuth, or combinations thereof. A solder reflowing process is performed to form solder bump 660a, as shown in FIG. 6A.

In alternative embodiments, as shown in FIG. 6B, the thickness of copper layer 650 is increased so that copper layer 650 becomes a copper post (or pillar). In some embodiments, after the optional formation of metal layer 652 on copper post 650, a solder layer 662, which may be a thin solder layer, may be plated on metal layer 652. The embodiments shown in FIGS. 6A and 6B are only two examples; other embodiments of bumps are also possible. Further details of bump formation process may be found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are incorporated herein in their entireties.

The embodiments described above provide mechanisms for performing functional tests on devices connected to microbump pads under microbumps. Test pads that are larger than microbumps are formed to allow such testing. Due to the surface areas saved by using microbumps, the effect of test pads on surface real-estate of semiconductor chips could be reduced to minimum or none. The test pad can be connected to one or more microbump pads during testing. These one or more microbumps may be distributed symmetrically or asymmetrically around the test pads. The test pads could be damaged due to circuit probing and could be covered by a passivation layer after probing to protect the damaged surface.

An aspect of this description relates to a package. The package includes a semiconductor chip. The semiconductor chip includes a test pad, and a plurality of microbump pads, wherein each microbump pad of the plurality of microbump pads is electrically connected to the test pad. The package further includes a substrate; and a plurality of microbumps configured to electrically connect the semiconductor chip to the substrate, wherein each microbump of the plurality of microbumps is electrically connected to a corresponding microbump pad of the plurality of microbump pads. The package further includes a package substrate, wherein the package substrate comprises a bump pad, wherein an area of the bump pad is greater than a combined area of the test pad and the plurality of microbump pads. The package further includes a bump configured to electrically connect the substrate to the package substrate.

Another aspect of this description relates to a test structure. The test structure includes an array of connection pads on a chip, wherein a width of each connection pad of the array of connection pads is equal to or less than about 50 microns ($\mu$m). The test structure further includes an interconnect structure connected to the array of connection pads. The test structure further includes an array of test pads around a periphery of the array of connection pads, wherein a test pad of the array of test pads is connected to a corresponding connection pad of the array of connection pads through the interconnect structure, wherein a width of the test pad is greater than a width of the corresponding connection pad, and the test pad is adapted to be covered after circuit probing by a passivation material to prevent particle and corrosion issues.

Still another aspect of this description relates to a method of testing a chip. The method includes probing a test pad with a probe. The test pad is electrically connected to a first microbump pad and a second microbump pad. A size of the probe is larger than the first microbump pad or the second microbump pad. Probing the test pad causes damage to the test pad. The method further includes depositing a passivation layer over the damaged test pad, wherein the passivation layer is configured to prevent particle and corrosion issues.

Various modifications, changes, and variations apparent to those of skill in the art may be made in the arrangement, operation, and details of the methods and systems disclosed. Although the foregoing embodiments have been described in some detail for purposes of clarity of understanding, it will be apparent that certain changes and modifications may be practiced within the scope of the appended claims. Accordingly, the present embodiments are to be considered as illustrative and not restrictive, and the disclosure is not to be limited to the details given herein, but may be modified within the scope and equivalents of the appended claims.

What is claimed is:

1. A package comprising:
   a semiconductor chip, wherein the semiconductor chip comprises:
      a test pad, and
      a plurality of microbump pads, wherein each microbump pad of the plurality of microbump pads is electrically connected to the test pad;
   a substrate;
   a plurality of microbumps configured to electrically connect the semiconductor chip to the substrate, wherein each microbump of the plurality of microbumps is electrically connected to a corresponding microbump pad of the plurality of microbump pads;
   a package substrate, wherein the package substrate comprises a bump pad, wherein an area of the bump pad is greater than a combined area of the test pad and the plurality of microbump pads; and
   a bump configured to electrically connect the substrate to the package substrate.

2. The package of claim 1, wherein the plurality of microbump pads are located in a symmetrical arrangement around the test pad.

3. The package of claim 1, wherein the plurality of microbump pads are asymmetrically arranged with respect to the test pad.

4. The package of claim 1, wherein a shape of the test pad is selected from the group consisting of a square, a rectangle, a circle, a hexagon, and an octagon.

5. The package of claim 1, wherein a minimum width of the test pad is at least 60 microns ($\mu$m).

6. The package of claim 1, wherein a diameter of the bump ranges from about 75 $\mu$m to about 150 $\mu$m.

7. The package of claim 1, wherein a first microbump pad of the plurality of microbump pads is electrically connected to the test pad through a second microbump pad of the plurality of microbump pads.

8. The package of claim 1, wherein a connection between a first microbump pad of the plurality of microbump pads and the test pad comprises:
   a first portion extending in a first direction, and
   a second portion extending in a second direction different from the first direction.

9. A test structure comprising:
   an array of connection pads on a chip, wherein a width of each connection pad of the array of connection pads is equal to or less than about 50 microns ($\mu$m);
   an interconnect structure connected to the array of connection pads; and
   an array of test pads around a periphery of the array of connection pads, wherein a test pad of the array of test pads is connected to a corresponding connection pad of the array of connection pads through the interconnect structure, wherein a width of the test pad is greater than a width of the corresponding connection pad, and the test pad is adapted to be covered after circuit probing by a passivation material to prevent particle and corrosion issues.

10. The test structure of claim 9, wherein a connection pad of the array of connection pads comprises:
- a metal pad connected to the interconnect structure;
- a diffusion barrier layer over the metal pad; and
- a seed layer over the diffusion barrier layer.

11. The test structure of claim 10, further comprising a copper pillar over the seed layer, wherein the copper pillar is configured to electrically connect the chip to a substrate.

12. The test structure of claim 10, further comprising a solder layer over the seed layer, wherein the solder layer is configured to electrically connect the chip to a substrate.

13. The test structure of claim 9, wherein the interconnect structure between the test pad of the array of test pads and the corresponding connection pad comprises:
- a first portion extending in a first direction, and
- a second portion extending in a second direction different from the first direction.

14. The test structure of claim 13, wherein the first direction is substantially perpendicular to the second direction.

15. The test structure of claim 9, wherein at least one connection pad of the array of connection pads is electrically separated from each test pad of the array of test pads.

16. The test structure of claim 9, wherein a first connection pad of the array of connection pads is electrically connected to a second connection pad of the array of connection pads by the interconnect structure.

17. A method of testing a chip, the method comprising:
- probing a test pad with a probe, wherein the test pad is electrically connected to a first microbump pad and a second microbump pad, a size of the probe is larger than the first microbump pad or the second microbump pad, and probing the test pad causes damage to the test pad;
- depositing a passivation layer over the damaged test pad, wherein the passivation layer is configured to prevent particle and corrosion issues.

18. The method of claim 17, wherein depositing the passivation layer comprises depositing the passivation layer to a thickness ranging from about 1 micron ($\mu$m) to about 10 $\mu$m.

19. The method of claim 17, further comprising patterning the passivation layer to expose the first microbump pad and the second microbump pad.

20. The method of claim 17, wherein depositing the passivation layer comprises depositing the passivation layer comprising an organic polymer, a photosensitive polyimide or a dielectric material.

* * * * *